(12) United States Patent
Kim et al.

(10) Patent No.: US 8,093,948 B2
(45) Date of Patent: Jan. 10, 2012

(54) POWER AMPLIFIER

(75) Inventors: Yoo Hwan Kim, Gyunggi-do (KR); Yoo Sam Na, Seoul (KR); Byeong Hak Jo, Gyunggi-do (KR); Hyun Hwan Yoo, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/883,941

(22) Filed: Sep. 16, 2010

(65) Prior Publication Data

US 2011/0156813 A1 Jun. 30, 2011

(30) Foreign Application Priority Data

Dec. 28, 2009 (KR) .................. 10-2009-0132232

(51) Int. Cl.
*H03G 3/20* (2006.01)
(52) U.S. Cl. .................. 330/136; 330/129
(58) Field of Classification Search ............. 330/129, 330/136, 278
See application file for complete search history.

(56) References Cited

U.S. PATENT DOCUMENTS

| | | | |
|---|---|---|---|
| 5,138,274 A * | 8/1992 | Nakanishi et al. | 330/136 |
| 6,683,496 B2 * | 1/2004 | Poggi et al. | 330/132 |
| 6,759,902 B2 * | 7/2004 | Kossor | 330/136 |
| 7,466,195 B2 * | 12/2008 | Drogi et al. | 330/136 |
| 7,868,699 B2 * | 1/2011 | Ono et al. | 330/302 |
| 2008/0007341 A1 | 1/2008 | Ripley et al. | |

FOREIGN PATENT DOCUMENTS

| | | |
|---|---|---|
| KR | 1020010066453 A | 7/2001 |
| KR | 1020020094628 A | 12/2002 |
| KR | 10-2008-0091377 A | 10/2008 |
| WO | 2007/092195 A2 | 8/2007 |

OTHER PUBLICATIONS

Korean Office Action for Application No. 10-2009-0132232 issued Mar. 10, 2011.

* cited by examiner

*Primary Examiner* — Henry Choe
(74) *Attorney, Agent, or Firm* — Lowe, Hauptman, Ham & Berner, LLP

(57) ABSTRACT

There is provided a power amplifier that can maintain a constant gain by detecting a level of a signal being input and a level of a signal being output. A power amplifier according to an aspect of the invention may include: an amplification section having at least one amplification unit amplifying an input signal according to an adjustable gain to thereby output the amplified input signal; a detection section detecting signal levels of an input signal and an output signal of the amplification section; and a gain maintaining section controlling a bias power according to a detection result of the detection section so that a gain of the amplification section is maintained within a predetermined gain range.

6 Claims, 5 Drawing Sheets

POWER AMPLIFIER

CROSS-REFERENCE TO RELATED APPLICATIONS

This application claims the priority of Korean Patent Application No. 10-2009-0132232 filed on Dec. 28, 2009, in the Korean Intellectual Property Office, the disclosure of which is incorporated herein by reference.

BACKGROUND OF THE INVENTION

1. Field of the Invention

The present invention relates to power amplifiers, and more particularly, to a power amplifier that can maintain a constant gain by detecting a level of a signal being input and a level of a signal being output.

2. Description of the Related Art

Mobile communications terminals have been widely used due to their easy of use.

In order to transmit and receive RF signals, a mobile communications terminal uses a power amplifier. This power amplifier amplifies a signal while maintaining linearity, which is one of the main functions thereof.

Meanwhile, the characteristics of the power amplifier may be deteriorated since the power amplifier cannot perform an amplification operation in which the power amplifier amplifies a signal while maintaining linearity due to changes in operation regions caused by semiconductor processes, changes in temperature, and other environmental factors.

In order to prevent this deterioration in the characteristics of the power amplifier, an appropriate bias voltage needs to be applied to the power amplifier.

To this end, in the related art, ambient temperature is detected using a thermistor, and a bias voltage level is changed according to a change in temperature so that the changed bias voltage level is applied to the power amplifier. However, the detection of changes in temperature by using a thermistor may be inaccurate. Also, when the bias voltage level does not change linearly according to changes in temperature, the power amplifier still cannot perform an amplification operation while maintaining linearity. Furthermore, a method of detecting a level of a signal being output from a power amplifier and changing a bias voltage level to thereby increase efficiency merely increases efficiency but cannot change a bias voltage level according to changes in environment, thereby causing a deterioration in linearity.

SUMMARY OF THE INVENTION

An aspect of the present invention provides a power amplifier that can maintain a constant gain by detecting a level of a signal being input and a level of a signal being output.

According to an aspect of the present invention, there is provided a power amplifier including: an amplification section having at least one amplification unit amplifying an input signal according to an adjustable gain to thereby output the amplified input signal; a detection section detecting signal levels of an input signal and an output signal of the amplification section; and a gain maintaining section controlling a bias power according to a detection result of the detection section so that a gain of the amplification section is maintained within a predetermined gain range.

The amplification section may include a plurality of amplification units connected in parallel with each other and each receiving the bias power.

The detection section may include: an input peak detector detecting the signal level of the input signal; and an output peak detector detecting the signal level of the output signal.

The gain maintaining section may include: a gain calculation unit calculating the gain of the amplification section according to the detection result of the detection section; a comparison unit performing a comparison to determine whether a calculation result of the gain calculation unit is within the predetermined gain range; and a bias supply unit supplying a corresponding bias power according to a result of the comparison of the comparison unit.

The comparison unit may include: a first comparator having a positive (+) terminal receiving the calculation result of the gain calculation unit and a negative (−) terminal receiving a first-range voltage having a predetermined voltage level; and a second comparator having a negative (−) terminal receiving the calculation result of the gain calculation unit and a positive (+) terminal receiving a second-range voltage having a predetermined voltage level lower than the predetermined voltage level of the first-range voltage.

The bias supply unit may include: a bit setting unit determining whether to increase, reduce, or maintain a bit value according to a comparison result of the comparison section; a control unit supplying a digital signal corresponding to a predetermined bias voltage according to the bit of the bit setting unit; and a bias voltage supply unit supplying a bias voltage corresponding to the digital signal of the control unit.

The control unit may include: a logic gate performing a logical operation on the bit of the bit setting unit; a first multiplexer selecting a high-level signal or a low-level signal according to the bit of the bit setting unit; a first flip-flop performing a D flip-flop operation on an addition result according to input data; a first adder adding a selection value of the first multiplexer and a value of the D flip-flop operation of the first flip-flop and transmitting an addition result to the first flip-flop; a second multiplexer selecting a high-level signal or a low-level signal according to a result of the logical operation from the logic gate; a second flip-flop performing a D flip-flop operation on an addition result according to input data; a second adder adding a selection value of the second multiplexer and a value of the D flip-flop operation of the second flip-flop and transmitting an addition result to the second flip-flop; a third multiplexer selecting a high-level signal or a low-level signal according to the logical operation result from the logic gate; a third flip-flop performing a D flip-flop operation on an addition result according to input data; and a third adder performing a selection value of the third multiplexer and a value of the D flip-flop operation of the third flip-flop and transmitting an addition result to the third flip-flop.

The power amplifier may include an input impedance matching section matching an impedance of a path through which the input signal, being input to the amplification section, is transmitted.

The power amplifier may include an output impedance matching section matching an impedance of a path through which the output signal, being output from the amplification section, is transmitted.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
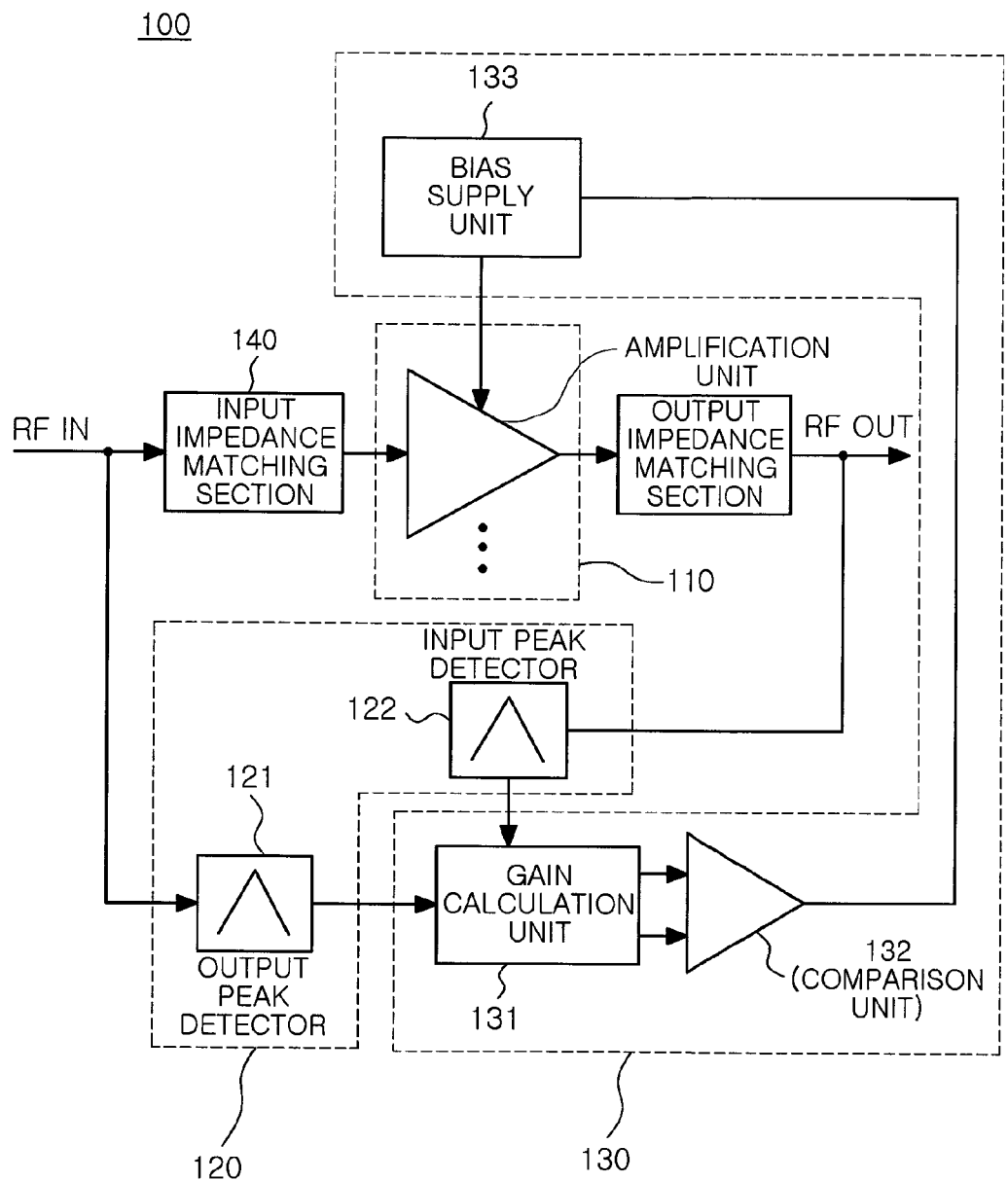
FIG. 1 is a schematic configuration view illustrating a power amplifier according to an exemplary embodiment of the present invention.

FIG. 1 is a schematic configuration view illustrating a power amplifier according to an exemplary embodiment of the invention.

Referring to FIG. 1, a power amplifier 100 according to this embodiment may include an amplification section 110, a detection section 120, and a gain maintaining section 130, and may further include an input impedance matching section 140 and an output impedance matching section 150.

The amplification section 110 may include at least one amplification unit that amplifies an input signal according to an adjustable gain to thereby output the amplified input signal. The at least one amplification unit may include a plurality of amplification units connected in parallel with each other.

The detection section 120 may detect a signal level of an input signal being input to the amplification section 110 and a signal level of an output signal being output from the amplification section 110. To this end, the detection section 120 may include an input peak detector 121 that detects the signal level of the input signal and an output peak detector 122 that detects the signal level of the output signal.

The gain maintaining section 130 may control a bias voltage, which is supplied to the amplification section 110, according to a detection result of the detection section 120, and may perform control so that the gain of the amplification section 110 is maintained within a predetermined gain range. To this end, the gain maintaining section 130 may include again calculation unit 131, a comparison unit 132, and a bias supply unit 133.

The gain calculation unit 131 may calculate the current gain of the amplification section 110 by using the signal level of the input signal detected by the input peak detector 121 of the detection section 120 and the signal level of the output signal detected by the output peak detector 122 of the detection section 120.

The comparison unit 132 may perform a comparison to determine whether the gain, calculated by the gain calculation unit 131, is within the predetermined gain range.

The bias supply unit 133 supplies the corresponding bias voltage to the amplification section 110 according to a comparison result of the comparison unit 132 so that the gain of the amplification section 110 is maintained within the predetermined gain range.

Plus, the power amplifier 100 may further include the input impedance matching section 140 and the output impedance matching section 150.

The input impedance matching section 140 may match the impedance of a path through which the input signal, being input to the amplification section 110 is transmitted, while the output impedance matching section 150 may match the impedance of a path through which the output signal, being output from the amplification section 110, is transmitted.

Figure 2:
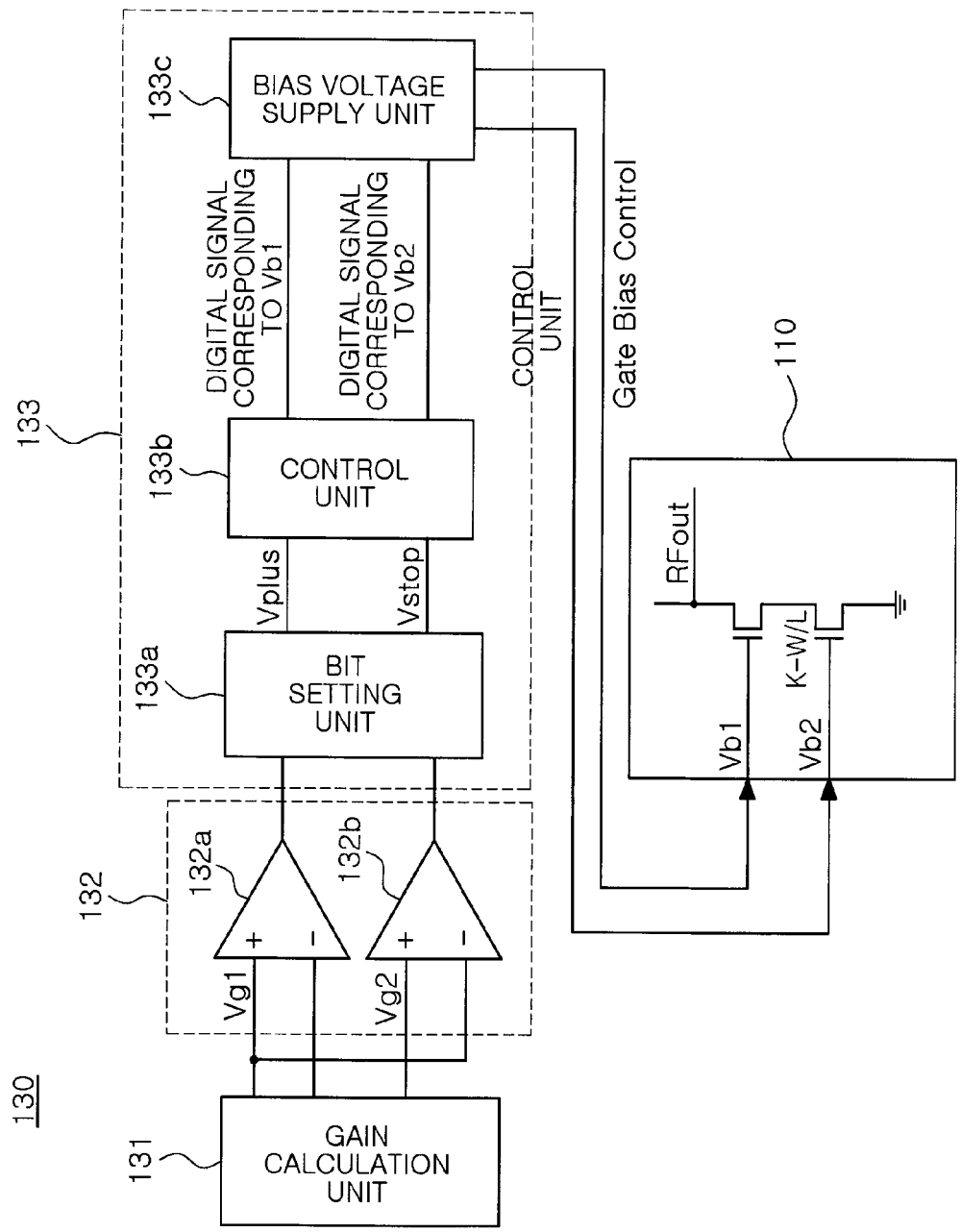
FIG. 2 is a schematic configuration view illustrating a gain maintaining section that is applied to a power amplifier according to an exemplary embodiment of the present invention.

FIG. 2 is a schematic configuration view illustrating a gain maintaining section that is applied to a power amplifier according to an exemplary embodiment of the invention.

Referring to FIG. 2, the gain maintaining section 130, which is applied to the power amplifier 100, may include a gain calculation unit 131, a comparison unit 132, and a bias supply unit 133.

The comparison unit 132 may include first and second comparators 132a and 132b. The first comparator 132a may have a positive (+) terminal receiving a calculation result of the gain calculation unit 131, and a negative (−) terminal receiving a first-range voltage Vg1 having a predetermined voltage level. The second comparator 132b may have a negative (−) terminal receiving a calculation result of the gain calculation unit 131 and a positive (+) terminal receiving a second-range voltage Vg2 having a predetermined level lower than the voltage level of the first-range voltage Vg1.

Thus, the comparison unit 132 may perform a comparison to determine whether a voltage value corresponding to the current gain of the amplification section 110, which is obtained by the gain calculation unit 131, is within the voltage levels of the first-range voltage Vg1 and the second-range voltage Vg2 that fall within the predetermined gain range.

The bias supply unit 133 may include a bit setting unit 133a, a control unit 133b, and a bias voltage supply unit 133c.

The bit setting unit 133a may determine whether to increase, reduce, or maintain a corresponding bit value according to the comparison result of the comparison unit 132.

Figure 4:
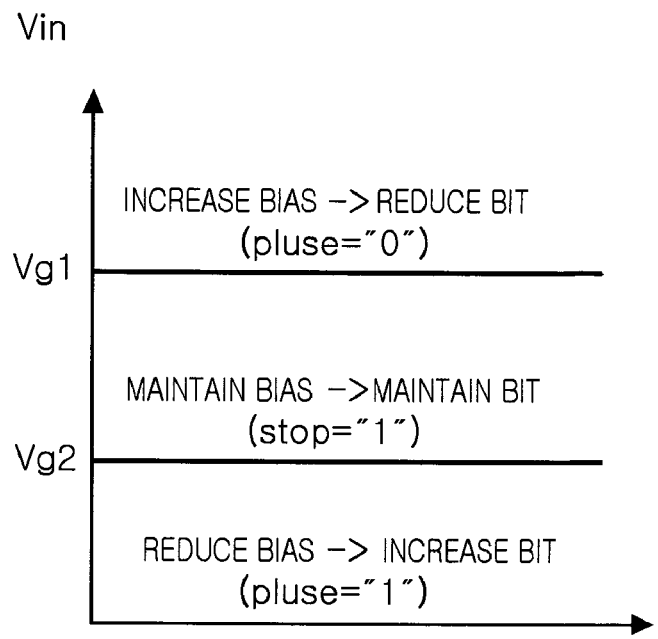
FIG. 4 is a view illustrating the operation of the gain maintaining section, shown in FIG. 2.

FIG. 4 is a view illustrating the operation of the gain maintaining section as shown in FIG. 2.

Referring to FIGS. 2 and 4, the bit setting unit 133a reduces a bit when the comparison result of the comparison unit 132 shows that the gain of the amplification section 110 is greater than a maximum value of the predetermined gain range, so that a first bit Vplus may be set to '0'. Also, when the comparison result of the comparison unit 132 shows that the gain of the amplification section 110 is within the predetermined gain range, the bit setting unit 133a maintains a bit, so that a second bit Vstop may be set to '1'. When the comparison result of the comparison unit 132 shows that the gain of the amplification section 110 is lower than a minimum value of the predetermined gain range, the bit setting unit 133a increases a bit value, so that the first bit Vplus may be set to '1'.

The control unit 133b may supply a digital signal corresponding to the bit set by the bit setting unit 133a.

Figure 3:
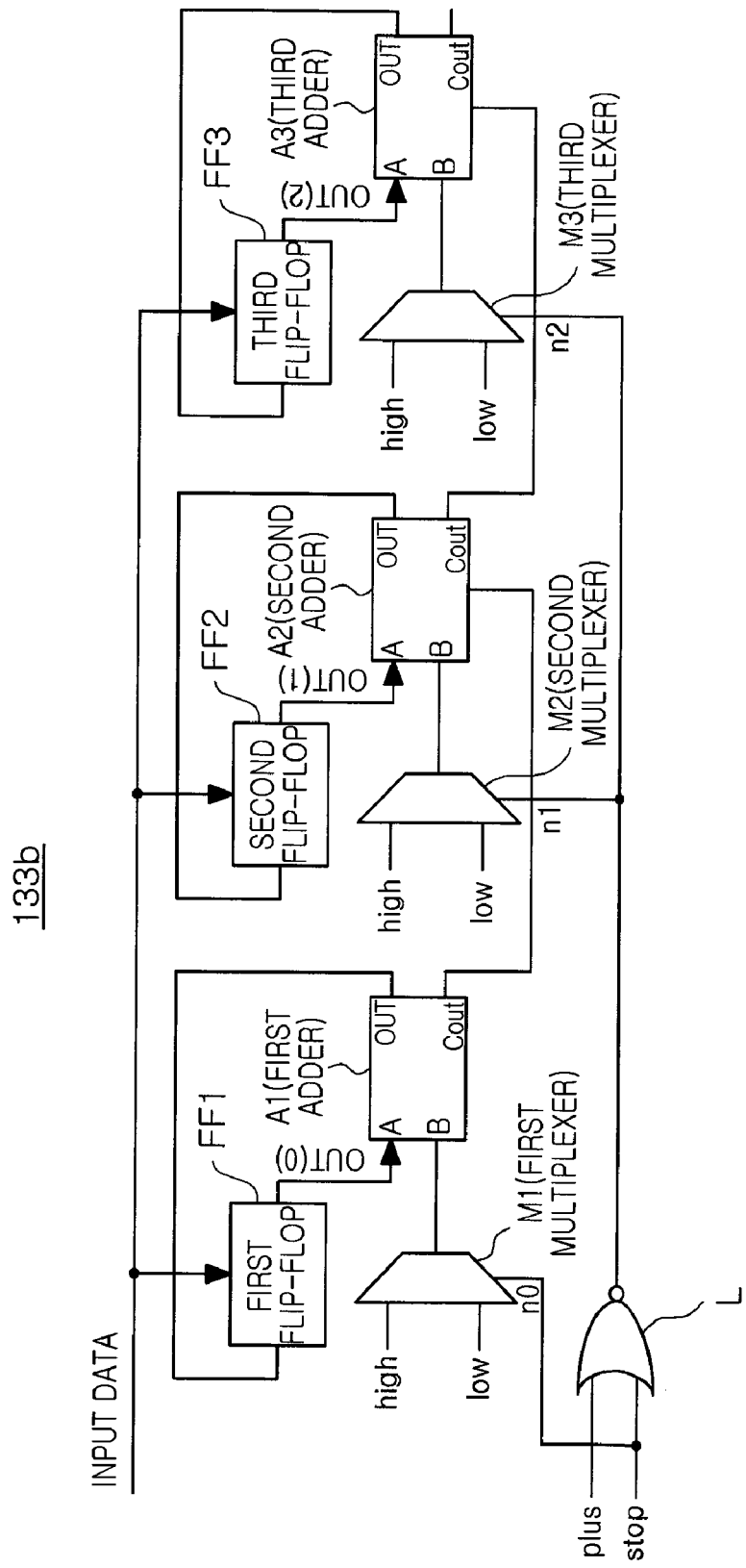
FIG. 3 is a schematic configuration view illustrating a control unit that is applied to a power amplifier according to an exemplary embodiment of the present invention.

FIG. 3 is a schematic configuration view illustrating a control unit that is applied to a power amplifier according to an exemplary embodiment of the invention.

Referring to FIG. 3, the control unit 133b may include a logic gate L, first to third multiplexers M1 to M3, first to third flip-flops FF1 to FF3, and first to third adders A1 to A3.

The logic gate L may perform a logical operation on the first bit Vplus and the second bit Vstop from the bit setting unit 133a. Preferably, the logic gate L may be a NOR (NOT OR) gate. The second bit Vstop, which is input to the logic gate L, may be transmitted to the first multiplexer (MUX) M1, and may transmit a result of the logical operation of the logic gate L, to the second and third multiplexers M2 and M3.

The first multiplexer M1 may select one signal between a high-level signal high and a low-level signal low according to the second bit Vstop, and transmit the selected signal to the first adder A1. The first adder A1 may add a result of the selection of the first multiplexer M1 and a logical operation result of the first flip-flop FF1 and transmit a result of the addition to the second adder A2 and the first flip-flop FF1. The first flip-flop FF1 may perform a D flip-flop operation on input data and the addition result of the first adder A1 to transmit a result of the D flip-flop operation to the first adder A1.

The second multiplexer M2 may select one between a high-level signal high and a low-level signal low according to the logical operation result of the logic gate L and transmit the selected signal to the second adder A2. The second adder A2 may add a result of the selection of the second multiplexer M2 and a logical operation result of the second flip-flop FF2 and transmit a result of the addition to the third adder A3 and the second flip-flop FF2. The second flip-flop FF2 may perform a D flip-flop operation on the input data and the addition result of the second adder A2 to transmit a result of the D flip-flop operation to the second adder A2.

The third multiplexer M3 may select one signal between a high-level signal high and a low-level signal low according to the logical operation result of the logic gate L and transmit the selected signal to the third adder A3. The third adder A3 may add a result of the selection of the third multiplexer M3 and a logical operation result of the third flip-flop FF3 and transmit a result of the addition to the third flip-flop FF3. The third flip-flop FF3 may perform a D flip-flop operation on the input data and the addition result of the third adder A3 and may transmit a result of the D flip-flop operation to the third adder A3.

The bias voltage supply unit 133c may supply corresponding bias voltages Vb1 and Vb2 to the amplification section 110 under the control of the control unit 133b so that the gain of the amplification section 110 may be within the predetermined range.

Figure 5:
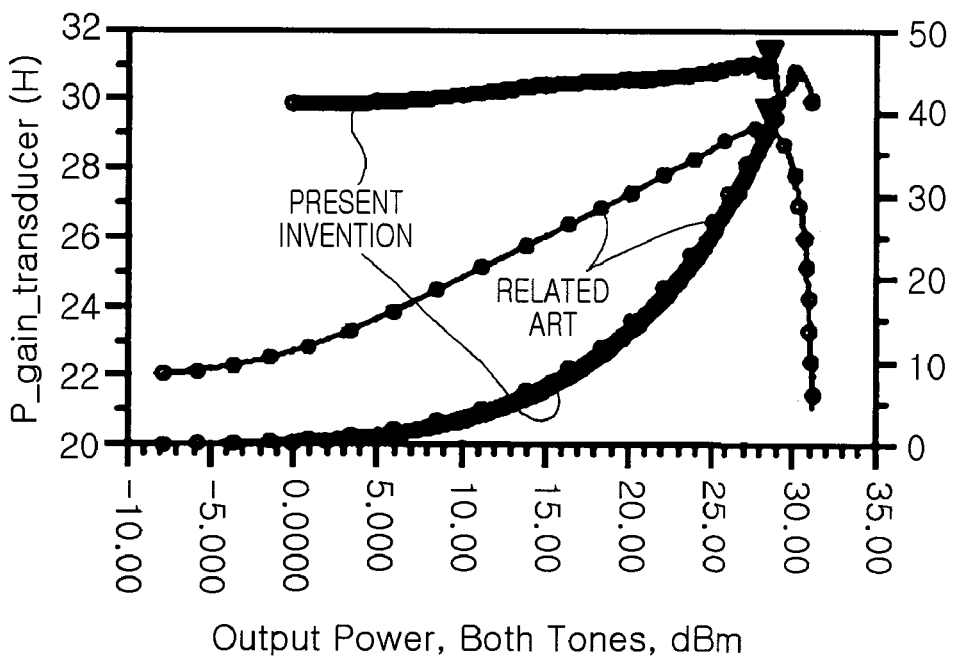
FIGS. 5 and 6 are graphs illustrating the electrical characteristics of a power amplifier according to an exemplary embodiment of the present invention.
Figure 6:
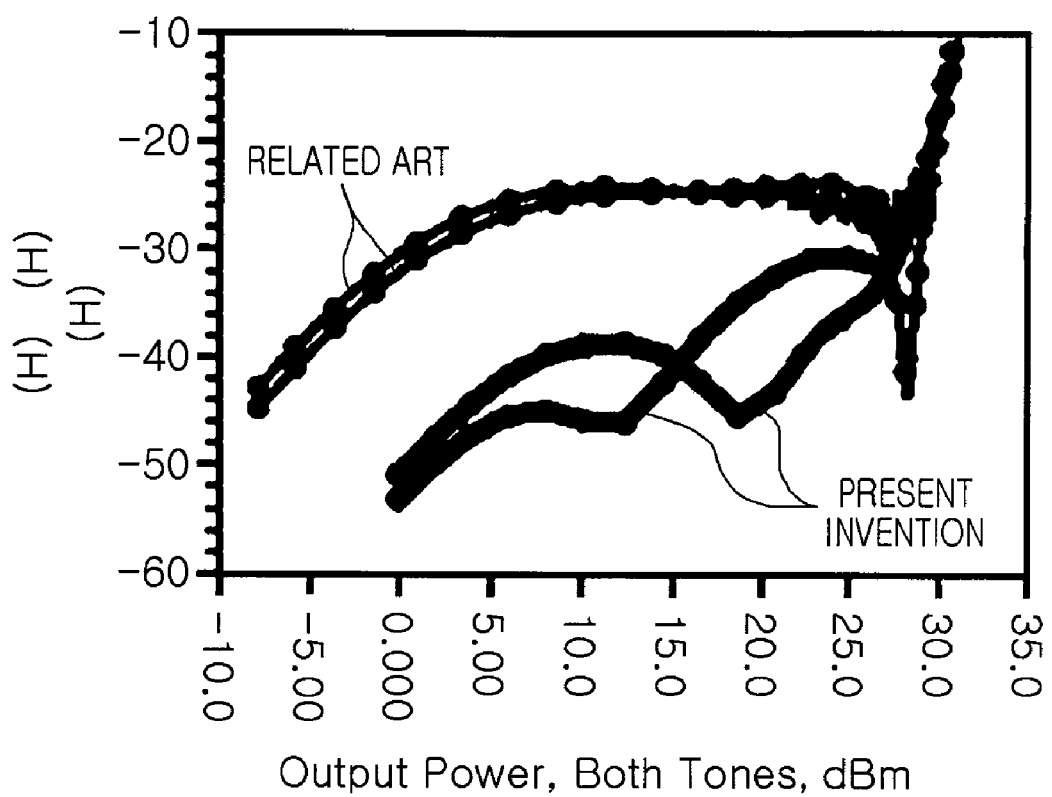

FIGS. 5 and 6 are graphs illustrating the electrical characteristics of a power amplifier according to an exemplary embodiment of the invention.

As shown in FIG. 5, a gain varies according to a bias voltage of the power amplifier 100. Thais is, as for a power amplifier according to the related art, a bias voltage is reduced due to external factors and thus a gain is reduced. On the other hand, as for a power amplifier according to an exemplary embodiment of the invention, a reduction in gain is detected to thereby increase a bias voltage, so that the increased bias voltage is supplied, so that the gain of the power amplifier is shown to be increased.

As shown in FIG. 6, as for the power amplifier according to the related art, a bias voltage is reduced due to external factors to thereby reduce a gain, so that the entire linearity thereof is shown to be reduced. On the other hand, as for a power amplifier according to an exemplary embodiment of the invention, a reduction in gain is detected to thereby increase a bias voltage and supply the increased bias voltage, and thus the gain is increased, so that the entire linearity thereof is shown to be improved.

As described above, a power amplifier according to an exemplary embodiment of the invention provides a variable supply of a bias voltage according to a detection result of an input signal and an output signal of the power amplifier when a change occurs in the gain of the power amplifier due to changes in environment to thereby maintain the gain thereof to fall within a predetermined range, thereby maintaining the linearity of the power amplifier.

As set forth above, according to exemplary embodiments of the invention, a gain of a power amplifier is maintained to be constant by detecting a level of a signal being input and a level of a signal being output, thereby maintaining the linearity of the power amplifier.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifier comprising:
    an amplification section amplifying an input signal according to an adjustable gain to thereby output the amplified input signal;
    a detection section detecting signal levels of an input signal and an output signal of the amplification section; and
    a gain maintaining section controlling a bias power according to a detection result of the detection section so that a gain of the amplification section is maintained within a predetermined gain range,
    wherein the gain maintaining section comprises:
    a gain calculations unit calculating the gain of the amplification section according to the detection result of the detection section;
    a comparison unit performing a comparison to determine whether a calculation results of the gain calculation unit is within the predetermined gain range; and
    a bias supply unit supplying a corresponding bias power according to a result of the comparison of the comparison unit,
    wherein the comparison unit comprises:
    a first comparator having a positive (+) terminal receiving the calculation result of the gain calculation unit and a negative (−) terminal receiving a first-range voltage having a predetermined voltage level; and
    a second comparator having a negative (−) terminal receiving the calculation result of the gain calculation unit and a positive (+) terminal receiving a second-range voltage having a predetermined voltage level lower than the predetermined voltage level of the first-range voltage.

2. The power amplifier of claim 1, wherein the detection section comprises:
    an input peak detector detecting the signal level of the input signal; and
    an output peak detector detecting the signal level of the output signal.

3. The power amplifier of claim 1, wherein the bias supply unit comprises:
    a bit setting unit determining whether to increase, reduce, or maintain a bit value according to a comparison result of the comparison section;
    a control unit supplying a digital signal corresponding to a predetermined bias voltage according to a bit of the bit setting unit; and
    a bias voltage supply unit supplying a bias voltage corresponding to the digital signal of the control unit.

4. The power amplifier of claim 3, wherein the control unit comprises:
    a logic gate performing a logical operation on the bit of the bit setting unit;
    a first multiplexer selecting a high-level signal or a low-level signal according to the bit of the bit setting unit;
    a first flip-flop performing a D flip-flop operation on an addition result according to input data;

a first adder adding a selection value of the first multiplexer and a value of the D flip-flop operation of the first flip-flop and transmitting an addition result to the first flip-flop;

a second multiplexer selecting a high-level signal or a low-level signal according to a result of the logical operation from the logic gate;

a second flip-flop performing a D flip-flop operation on an addition result according to input data;

a second adder adding a selection value of the second multiplexer and a value of the D flip-flop operation of the second flip-flop and transmitting an addition result to the second flip-flop;

a third multiplexer selecting a high-level signal or a low-level signal according to the logical operation result from the logic gate;

a third flip-flop performing a D flip-flop operation on an addition result according to input data; and a third adder performing a selection value of the third multiplexer and a value of the D flip-flop operation of the third flip-flop and transmitting an addition result to the third flip-flop.

5. The power amplifier of claim 1, further comprising an input impedance matching section matching an impedance of a path through which the input signal, being input to the amplification section, is transmitted.

6. The power amplifier of claim 1, further comprising an output impedance matching section matching an impedance of a path through which the output signal, being output from the amplification section, is transmitted.

* * * * *